(12) United States Patent
Cho et al.

(10) Patent No.: US 10,128,107 B1
(45) Date of Patent: Nov. 13, 2018

(54) WAFERS HAVING III-NITRIDE AND DIAMOND LAYERS

(71) Applicant: RFHIC Corporation, Anyang-si (KR)

(72) Inventors: Sam Yul Cho, Raleigh, NC (US); Won Sang Lee, Chapel Hill, NC (US)

(73) Assignee: RFHIC CORPORATION, Anyang (KR)

( * ) Notice: Subject to any disclaimer, the term of this patent is extended or adjusted under 35 U.S.C. 154(b) by 0 days.

(21) Appl. No.: 15/693,333

(22) Filed: Aug. 31, 2017

(51) Int. Cl.
  *H01L 21/338* (2006.01)
  *H01L 21/02* (2006.01)
  *H01L 21/78* (2006.01)
  *H01L 29/66* (2006.01)
  *H01L 29/778* (2006.01)

(52) U.S. Cl.
  CPC ...... *H01L 21/0254* (2013.01); *H01L 21/0259* (2013.01); *H01L 21/0262* (2013.01); *H01L 21/02381* (2013.01); *H01L 21/02527* (2013.01); *H01L 21/02529* (2013.01); *H01L 21/02664* (2013.01); *H01L 21/7806* (2013.01); *H01L 29/66462* (2013.01); *H01L 29/778* (2013.01)

(58) Field of Classification Search
  CPC ........... H01L 21/0254; H01L 21/02527; H01L 21/02529; H01L 21/02378; H01L 21/02389; H01L 29/778; H01L 29/66462; H01L 29/2003; H01L 29/1602; H01L 29/1608; H01L 29/7783; H01L 2924/13064; H01L 33/007; H01L 33/0075
  USPC .................................................. 438/167, 172
  See application file for complete search history.

(56) References Cited

U.S. PATENT DOCUMENTS

2012/0074427 A1* 3/2012 Lahreche .......... H01L 21/02378
                                                                        257/76

\* cited by examiner

*Primary Examiner* — Hsien Ming Lee
(74) *Attorney, Agent, or Firm* — Patent Office of Dr. Chung Park (57) ABSTRACT

Wafers including a diamond layer and a semiconductor layer having III-Nitride compounds and methods for fabricating the wafers are provided. A first SiC layer is formed on a silicon substrate, and using a carbon containing gas, a surface of the first SiC layer is carbonized to form carbon particles on the SiC layer. Then, a diamond layer is grown on the carbonized surface, where the carbon atoms act as seed particles for growing the diamond layer. A second SiC layer is formed on the diamond layer and a semiconductor layer having III-Nitride compounds is formed on the second SiC layer. Then, the silicon substrate and the first SiC layer are removed.

20 Claims, 8 Drawing Sheets

WAFERS HAVING III-NITRIDE AND DIAMOND LAYERS

BACKGROUND

A. Technical Field

The present invention relates to semiconductor wafers, and more particularly, to wafers having a diamond layer and a semiconductor layer including III-nitride semiconductor material and methods for fabricating the wafers.

B. Background of the Invention

Gallium Nitride (GaN) or AlGaN or AlN has electrical and physical properties that make it highly suitable for radio frequency (RF) devices, such as high electron mobile transistors (HEMT). In general, an RF device produces a large amount of heat energy during operation, requiring a mechanism to extract the heat energy from the device to avoid device failure. Diamond is known to have a good thermal conductivity and can be used as material for a substrate on which the AlGaN/GaN layer is formed.

One conventional approach to form a AlGaN/GaN HEMT layer on a diamond layer is depositing AlGaN/GaN HEMT layer directly on a silicon substrate, removing the silicon substrate and forming a diamond layer on the AlGaN/GaN HEMT layer. This approach is attractive for its low manufacturing cost. Also, the material property of silicon enables producing large silicon wafers with low surface roughness, which in turn enables producing large AlGaN/GaN HEMT wafers. In addition, the silicon substrate can be removed relatively easily by conventional wafer processing techniques. However there are still difficulties in growing a high-quality AlGaN/GaN layer directly on a silicon substrate due to the large lattice mismatch between AlGaN/GaN and silicon. As such, there is a need for methods for fabricating wafers that have a diamond layer and an AlGaN/GaN layer with enhanced material property.

SUMMARY OF THE DISCLOSURE

In embodiments, a wafer includes: a semiconductor layer including a III-Nitride compound; a SiC layer formed on the semiconductor layer; an intermediate layer formed on the SiC layer; a seed layer formed on the intermediate layer and including diamond particles; and a diamond layer formed on the seed layer.

In embodiments, a method for forming a wafer includes: forming a SiC layer on a silicon substrate; forming a semiconductor layer including a III-Nitride compound on the SiC layer; removing the silicon substrate to expose a surface of the SiC layer; forming an intermediate layer on the exposed surface of the SiC layer; forming a seed layer on the intermediate layer, the seed layer including diamond particles; and growing a diamond layer on the seed layer.

In embodiments, a wafer includes: a semiconductor layer including a III-Nitride compound; an intermediate layer formed on the semiconductor layer; a seed layer formed on the intermediate layer and including diamond particles; and a diamond layer formed on the seed layer.

In embodiments, a method for forming a wafer includes: forming a SiC layer on a silicon substrate; forming a semiconductor layer including a III-Nitride compound on the SiC layer; removing the silicon substrate and the SiC layer; forming an intermediate layer on the SiC layer; forming a seed layer on the intermediate layer, the seed layer including diamond particles; and growing a diamond layer on the seed layer.

In embodiments, a wafer includes: a diamond layer having an oriented crystal structure; a SiC layer formed on the diamond layer; and a semiconductor layer including a III-Nitride compound and formed on the SiC layer.

In embodiments, a method for forming a wafer includes: forming an intermediate layer on a silicon substrate; forming a seed layer on the intermediate layer, the seed layer including diamond particles; growing a diamond layer on the seed layer; forming a SiC layer on the diamond layer; forming a semiconductor layer including a III-Nitride compound on the SiC layer; and removing the silicon substrate, seed layer and intermediate layer.

In embodiments, a method for forming a wafer includes: forming a first SiC layer on a silicon substrate; carbonizing a surface of the first SiC layer; growing a diamond layer on the carbonzied surface of the first SiC layer; forming a second SiC layer on the diamond layer; forming a semiconductor layer on the second SiC layer, the semiconductor layer including a III-Nitride compound; and removing the silicon substrate and the first SiC layer.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

One skilled in the art shall recognize: (1) that certain steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

Figure 1:
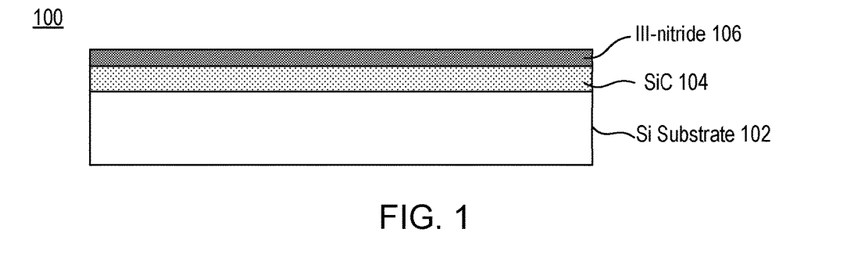
FIGS. 1-3 show an exemplary process for forming a wafer that includes a diamond layer and a III-Nitride layer according to embodiments of the present disclosure.
Figure 2:
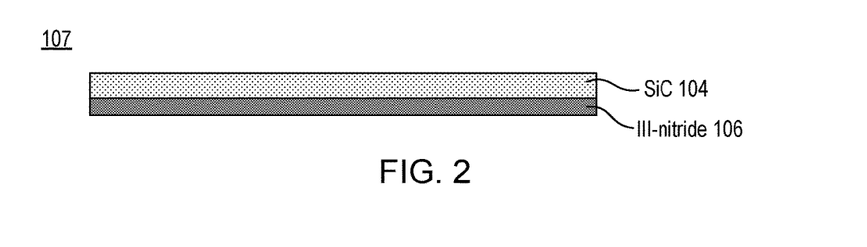
Figure 3:
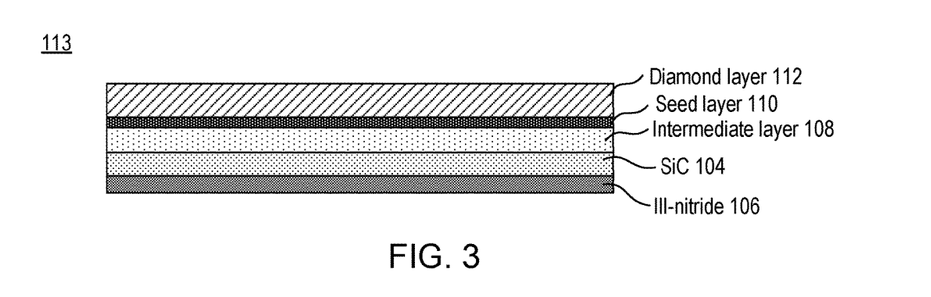

FIGS. 1-3 show an exemplary process for forming a wafer that includes a diamond layer and a III-Nitride layer according to embodiments of the present disclosure. As depicted, the wafer 100 may include a silicon substrate 102, and a SiC layer 104 and a III-Nitride layer 106 may be formed on the silicon substrate 102.

In embodiments, the SiC layer 104 may include cubic silicon carbide (3C—SiC) and formed on the silicon substrate 102 by conventional wafer processing techniques, such as low pressure chemical vapor deposition (LPCVD) technique. In embodiments, the III-Nitride layer 106 may include one or more layers that each include a GaN compound, such as hexagonal AlGaN/GaN or cubic AlGaN/GaN. For the purpose of brevity, in the following sections, a III-Nitride layer may collectively refer to one or more layers that each include a III-Nitride compound. In embodiments, the III-Nitride layer 106 may be formed on the SiC layer 104 by conventional wafer processing techniques, such as metal-organic chemical vapor deposition (MOCVD) technique.

In embodiments, various electronic components, such as transistors, may be formed in the III-Nitride layer 106 of the wafer 100 by conventional wafer processing techniques. The lattice mismatch between III-Nitride compound (or, shortly III-Nitride) and SiC is lower than the lattice mismatch between III-Nitride and Si. As such, compared to a case where the SiC layer 104 is not disposed between the III-Nitride layer 106 and the silicon substrate 102, the III-Nitride layer 106 on the SiC layer 104 has an improved material property for the electronic components.

In embodiments, after processing the III-Nitride layer 106, the silicon substrate 102 may be removed by conventional wafer processing techniques, such as grind/lap and polishing, to form the wafer 107. Then, as depicted in FIG. 3, the wafer 107 may be flipped over and an intermediate layer 108, a seed layer 110 and a diamond layer 112 may be sequentially formed on the SiC layer 104.

If the diamond layer 112 is directly attached to the SiC layer 104, the mismatch of coefficients of thermal expansion (CTE) between the diamond layer 112 and the SiC layer 104 may generate stress on the SiC layer 104 during formation of the diamond layer 112. In embodiments, the material and thickness of the intermediate layer 108 may be selected to mitigate the stress due to the mismatch of CTEs. In embodiments, the intermediate layer 108 may be formed of dielectric material, such as poly-Si or SiO or SiN.

In embodiments, to form the seed layer 110, a wafer including the layers 106, 104 and 108 may be submerged in an aqueous suspension of diamond nano particle (diamond seed particles) so that the top surface of the intermediate layer 108 may be in direct contact with the aqueous suspension. The diamond particles may be adsorbed onto the surface of the intermediate layer 108, to form the seed layer 110. Depending on the exposure time in the suspension and the concentration of the diamond particles, the density of the particles in the seed layer 110 may be determined. Since the diamond particles may adhere to the intermediate layer 108 better than to the SiC layer 104, the intermediate layer 108 may enhance the particle number density of the seed layer 110.

In embodiments, the intermediate layer 108 may protect the SiC layer 104 and the III-Nitride layer 106 from thermal damages during the process for forming the seed layer 110 and diamond layer 112. In addition, the intermediate layer 108 may electrically insulate the SiC layer 110 from the diamond layer 112. In embodiments, the diamond layer 112 may be formed by chemical vapor deposition (CVD) technique, even though other suitable techniques may be used. In embodiments, the diamond layer 112 may have a polycrystal structure.

In embodiments, the III-nitride wafer 113 may be diced and used in various electrical devices. Since the electronic component formed in the III-Nitride 106 of the wafer 111 may generate heat energy during operation of the electrical devices and the heat energy may be transferred to diamond layer 112 via the SiC layer 104, intermediate layer 108, and seed layer 110. Since SiC has lower thermal conductivity than diamond, the heat flow from the III-Nitride layer 106 to the diamond layer 112 may be reduced if the SiC layer 104 is too thick. In embodiments, the thickness of the SiC layer 104 may be minimized so that the heat flow to the diamond layer 112 is enhanced while the SiC layer 104 may be still thick enough to mitigate the lattice mismatch between the Si substrate 102 and the III-Nitride layer 106.

Figure 4:
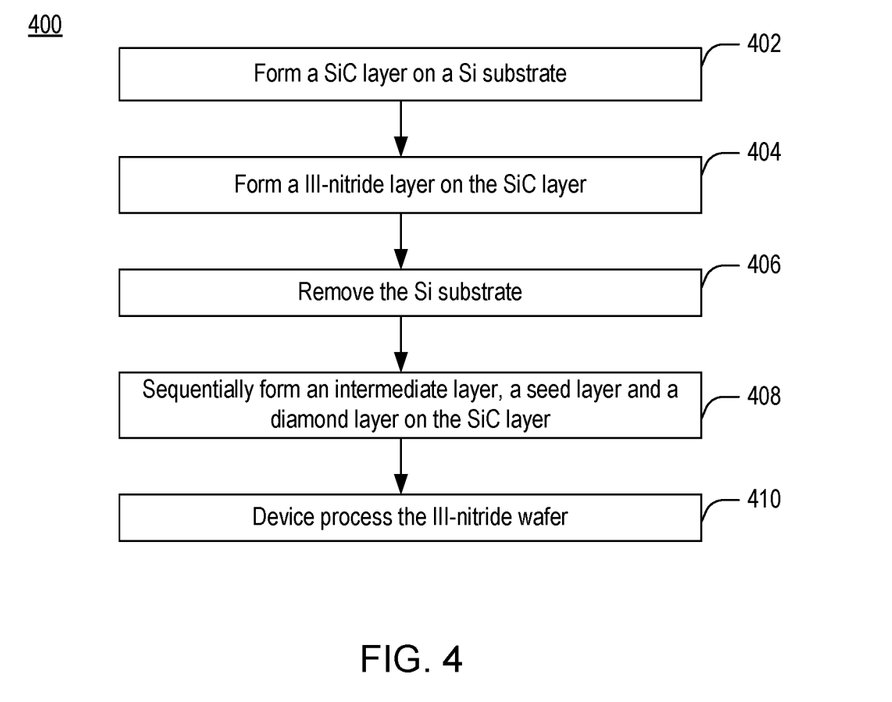
FIG. 4 shows a flowchart of an exemplary process for fabricating the wafers in FIGS. 1-3.

FIG. 4 shows a flowchart 400 of an exemplary process for fabricating the wafers in FIGS. 1-3. At steps 402 and 404, a SiC layer may be formed on a silicon substrate and a III-Nitride layer is formed on the SiC layer, respectively. Since the lattice mismatch between the SiC and III-nitride is lower than the lattice mismatch between Si and III-nitride, the SiC layer may enhance the material property of the III-nitride layer. At step 406, the Si substrate may be removed. Then, at step 408, an intermediate layer, seed layer and a diamond layer may be sequentially formed on the SiC layer. Optionally, the III-Nitride wafer may be device processed so that electrical components, such as transistors, may be formed in the III-Nitride layer by conventional wafer processing techniques at step 410.

Figure 5:
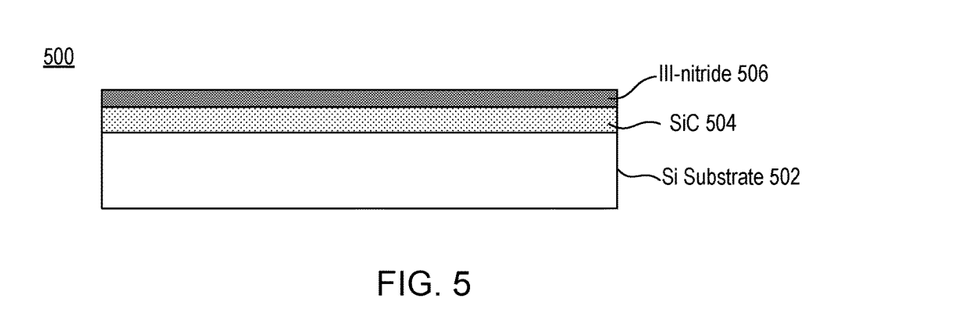
FIGS. 5-7 show an exemplary process for forming a wafer that includes a diamond layer and a III-Nitride layer according to embodiments of the present disclosure.
Figure 6:
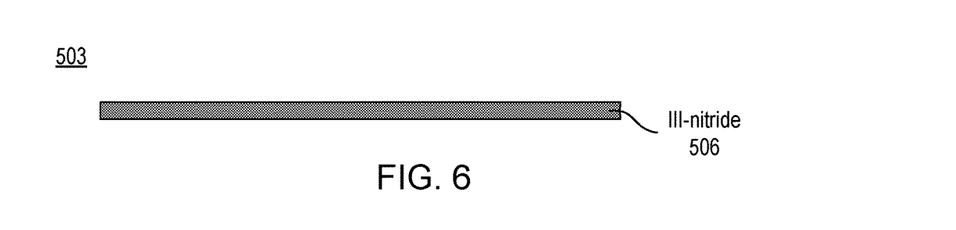
Figure 7:
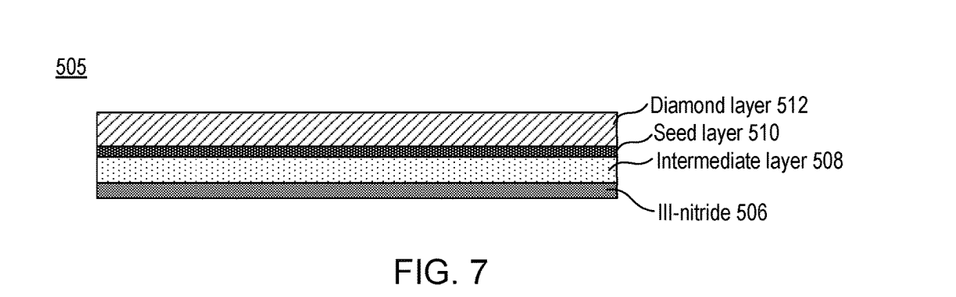

FIGS. 5-7 show an exemplary process for forming a wafer that includes a diamond layer and a III-Nitride layer according to embodiments of the present disclosure. As shown in FIG. 5, the wafer 500 may have the similar structure as the wafer 100 in FIG. 1. Also, the SiC layer 504 and III-Nitride layer 506 may be made of similar materials and have similar functions as the SiC layer 104 and III-Nitride layer 106, respectively. Then, the Si substrate 502 and the SiC layer 504 may be removed from the substrate 500 to form the wafer 503. Then, a intermediate layer 508, a seed layer 510 and a diamond layer 512 may be formed on the III-Nitride layer 506 of the wafer 503.

In embodiments, the intermediate layer 508, seed layer 510 and diamond layer 512 may be formed by similar techniques and have similar structures as their counterparts in the wafer 113. The wafer 505 may be similar to the wafer 113, with the difference that the SiC layer 504 is entirely removed from the wafer 500. In embodiments, the SiC layer 504 may be removed by conventional techniques, such as chemical etching, dry etching, lapping (mechanical grinding) or chemical mechanical polishing (CMP).

Since the wafer 505 does not include any SiC layer, the heat flow rate from the III-Nitride 506 to the diamond layer 512 may be higher than the heat flow rate from the III-Nitride layer 106 to the diamond layer 112, assuming that the intermediate layer 508 and seed layer 510 in the wafer 513 have the same compositions and thicknesses as their counterparts in the wafer 113. In embodiments, various electrical components, such as transistors, may be formed in the III-Nitride layer 506 of the wafer 505.

Figure 8:
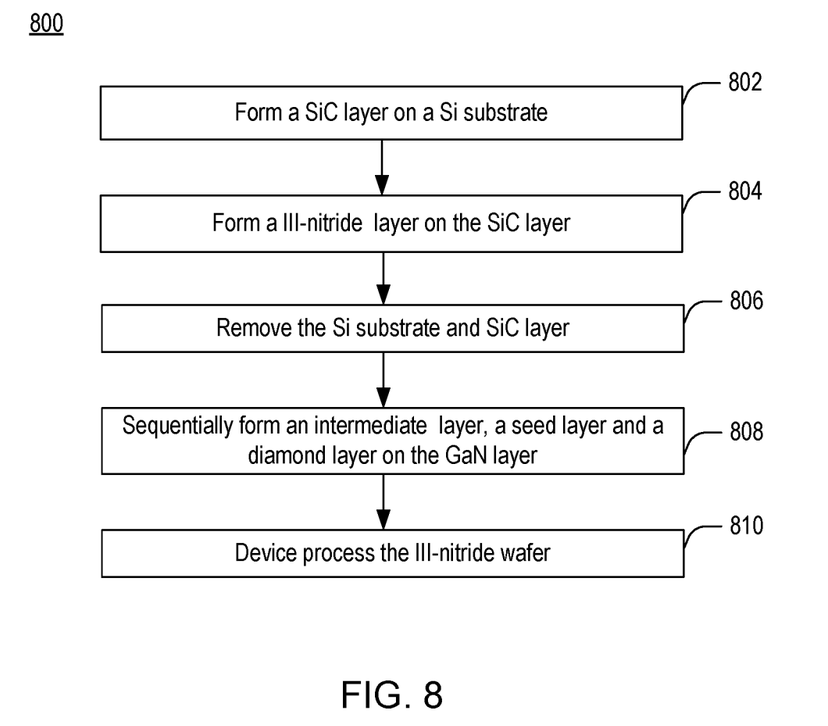
FIG. 8 shows a flowchart of an exemplary process for fabricating the wafers in FIGS. 5-7.
Figure 9:
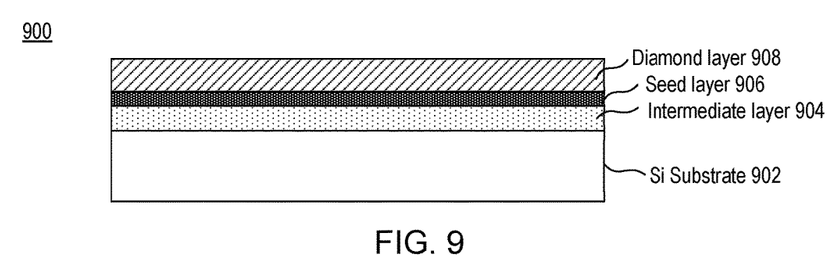
FIGS. 9-11 show an exemplary process for forming a wafer that includes a diamond layer and a III-Nitride layer according to embodiments of the present disclosure.
Figure 10:
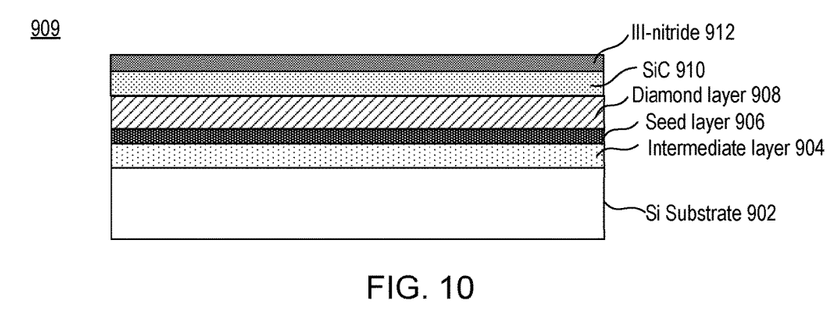
Figure 11:
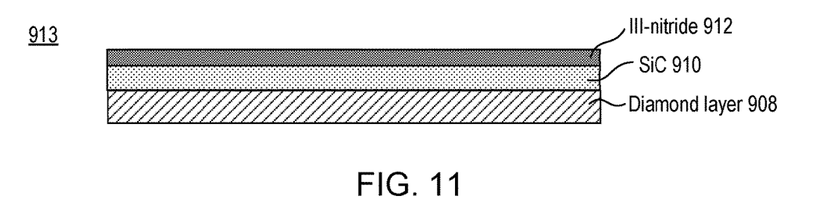

FIG. 8 shows a flowchart 800 of an exemplary process for fabricating the wafers in FIGS. 5-7. At steps 802 and 804, a SiC layer is formed on a silicon substrate and a III-Nitride layer is formed on the SiC layer, respectively. Since the lattice mismatch between the SiC and III-Nitride is lower than the lattice mismatch between silicon and III-Nitride, the SiC layer may enhance the material property of the GaN layer. At step 806, the silicon substrate and the SiC layer may be removed. Then, at step 808, an intermediate layer, a seed layer and a diamond layer may be sequentially formed on the III-Nitride layer. Optionally, the III-Nitride wafer may be device processed by conventional wafer processing techniques at step 810, to thereby form electrical components, such as transistors, in the III-Nitride layer FIGS. 9-11 show an exemplary process for forming a wafer that includes a diamond layer and a III-Nitride layer according to embodiments of the present disclosure. As depicted, the wafer 900 may include a silicon substrate 902, and an intermediate layer 904, a seed layer 906 and a diamond layer 908 are sequentially formed on the silicon substrate 902.

In embodiments, the intermediate layer 904 may be formed of dielectric material, such as poly-Si or SiN or SiO. In embodiments, to form the seed layer 906, a stack of layers including the layers 902 and 904 may be submerged in an aqueous suspension of diamond nano particle (diamond seed particles) so that the top surface of the intermediate layer 904 may be in direct contact with the aqueous suspension. The diamond particles may be adsorbed onto the surface of the intermediate layer 904, to form the seed layer 906. Depending on the exposure time in the suspension and the concentration of the diamond particles, the density of the particles in the seed layer 906 may be determined. Since the diamond particles may adhere to the intermediate layer 904 better than to the Si substrate 902, the intermediate layer 904 may enhance the particle number density of the seed layer 906.

In embodiments, the diamond layer 908 may be formed by chemical vapor deposition (CVD) technique, even though other suitable techniques may be used. In embodiments, the diamond seed particles in the seed layer 906 may act as seeds for growth of the diamond layer 908. In embodiments, the crystal structure of the Si substrate 902 may be transferred to the diamond layer 908 so that the diamond layer 908 may have an oriented crystal structure.

In embodiments, the top surface of the diamond layer 908 in the wafer 900 may be polished to generate a mirror-like epi-ready surface and to remove defects on the top surface. In embodiments, chemical mechanical polishing (CMP) technique or mechanical lapping may be used to polish the top surface. Then, as shown in FIG. 10, a SiC layer 910 may be formed on the polished epi-ready top surface of the diamond layer 908 and a III-Nitride layer 912 may be formed on the SiC layer 910. In embodiments, the SiC layer 910 may include cubic silicon carbide (3C—SiC).

The lattice mismatch between III-Nitride and SiC is lower than the lattice mismatch between III-Nitride and diamond. As such, compared to a case where the SiC layer 910 is not disposed between the III-Nitride layer 912 and the diamond layer 908, the III-Nitride 912 on the SiC layer 910 has an improved material property.

In embodiments, the SiC layer 910 may be deposited on the diamond layer 908 by conventional wafer processing techniques, such as low pressure chemical vapor deposition (LPCVD) technique. In embodiments, the III-Nitride layer 912 may be formed by conventional wafer processing techniques, such as MOCVD technique.

In embodiments, electronic components, such as transistors, may be formed in the III-Nitride layer 912 of the wafer 909 by conventional wafer processing techniques. Upon forming the electronic components, the Si substrate 902, intermediate layer 904, and seed layer 906 may be removed from the wafer 909. FIG. 11 shows a wafer 913 that includes three layers: the diamond layer 908, SiC layer 910 and III-Nitride layer 912. In embodiments, the wafer 913 may be diced and used in various electrical devices. The electronic component formed in the III-Nitride 912 may generate heat energy during operation of the electrical devices and the heat energy may be transferred to diamond layer 908 via the SiC layer 910. Since SiC has lower thermal conductivity than diamond, the heat flow from the III-Nitride layer 912 to the diamond layer 908 may be reduced if the SiC layer 910 is too thick. In embodiments, the thickness of the SiC layer 910 may be minimized so that the heat flow to the diamond layer 908 is enhanced while the SiC layer 910 may be still thick enough to enhance the material property of the III-Nitride layer 912.

Figure 12:
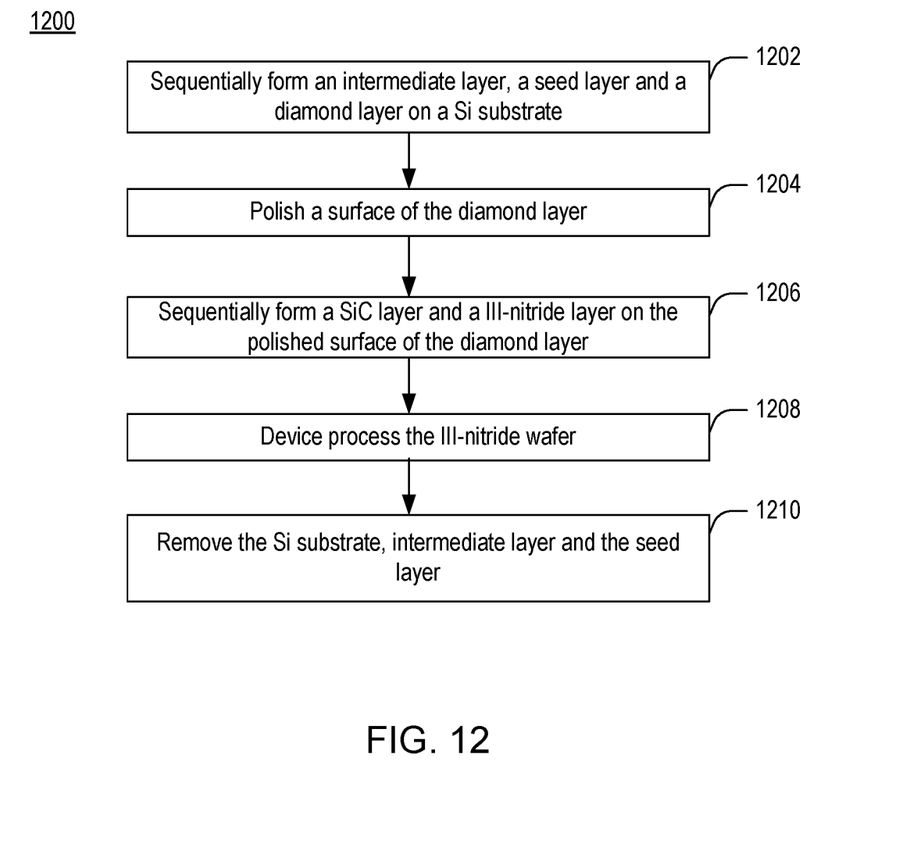
FIG. 12 shows a flowchart of an exemplary process for fabricating the wafers in FIGS. 9-11.

FIG. 12 shows a flowchart 1200 of an exemplary process for fabricating the wafers in FIGS. 9-11. At step 1202, an intermediate layer, a seed layer and a diamond layer may be formed on a Si substrate. Then, at step 1204, the top surface of the diamond layer may be polished to remove defects on the top surface and to generate a mirror-like epi-ready surface. At step 1206, a SiC layer may be formed on the polished epi-ready surface of the diamond layer and a III-Nitride layer may be formed on the SiC layer. Optionally, the III-Nitride layer 1208 may be device processed by conventional wafer processing techniques to form electronic components in the III-Nitride layer. Then, at step 1210, the Si substrate, intermediate layer and seed layer may be removed.

Figure 13:
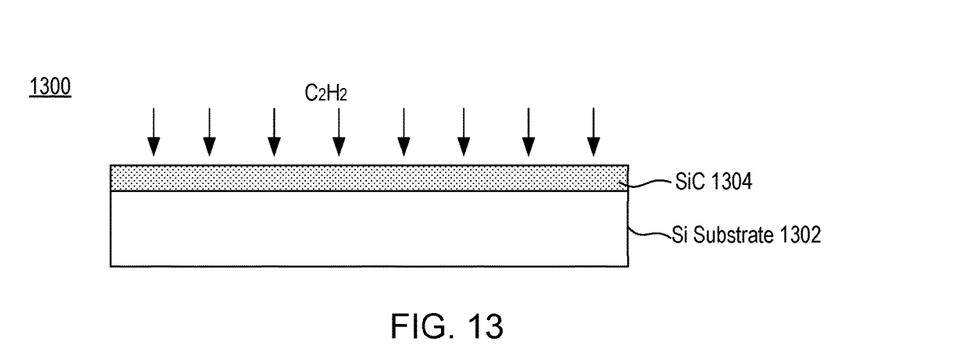
FIGS. 13-15 show an exemplary process for forming a wafer that includes a diamond layer and a III-Nitride layer according to embodiments of the present disclosure.
Figure 14:
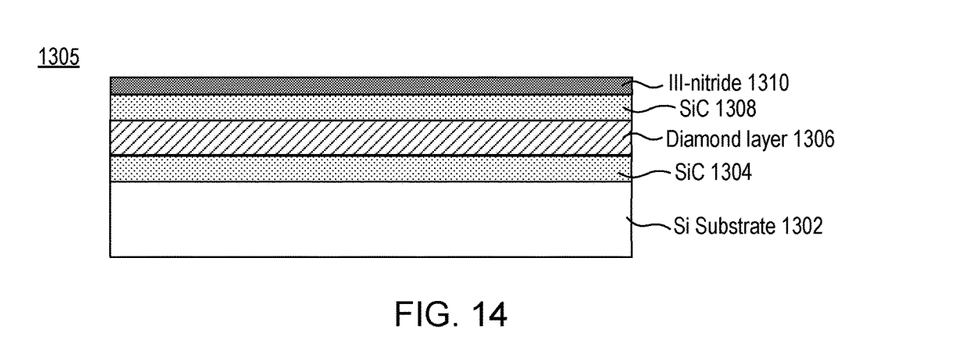
Figure 15:
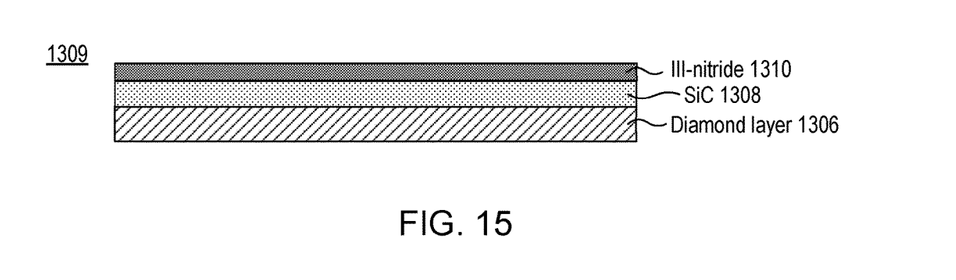

FIGS. 13-15 show an exemplary process for forming a wafer that includes a diamond layer and a III-Nitride layer according to embodiments of the present disclosure. As depicted in FIG. 13, a SiC layer 1304 may be formed on a Si substrate 1302. In embodiments, the SiC layer 1304 may include cubic silicon carbide (3C—SiC) and formed on the silicon substrate 1302 by conventional wafer processing techniques, such as low pressure chemical vapor deposition (LPCVD). Then, the top surface of the SiC layer 1304 may be carbonized by use of a carbon containing gas, such as $C_2H_4$ or $C_3H_8$ or $C_2H_2$. In embodiments, the wafer 1300 may be disposed in a thermal chemical vapor deposition reactor (not shown in FIG. 13) and the top surface of the SiC layer 1304 may be exposed to carbon containing gas, such as $C_2H_4$ or $C_3H_8$ or $C_2H_2$, causing the top surface of the SiC layer 1304 to be carbonized.

During the carbonization process, carbon atoms may adhere to the top surface of the SiC layer 1304. In embodiments, using the carbon atoms as seed particles, a diamond layer 1306 may be deposited on the SiC layer 1304. In embodiments, the diamond layer 1306 may be formed by chemical vapor deposition (CVD) technique, even though other suitable techniques may be used. The diamond layer 1306 may have an oriented crystal structure.

In embodiments, the top surface of the diamond layer 1306 may be polished to generate a mirror-like epi-ready surface and to remove defects on the top surface. In embodiments, chemical mechanical polishing (CMP) technique or mechanical lapping may be used to polish the top surface.

In embodiments, a SiC layer 1308 and a III-Nitride layer 1310 may be sequentially deposited on the diamond layer 1306, forming the wafer 1305. In embodiments, the SiC layer 1308 may include cubic silicon carbide (3C—SiC) and formed by conventional wafer processing techniques, such as low pressure chemical vapor deposition (LPCVD) technique. In embodiments, the III-Nitride layer 1310 may be formed on the SiC layer 1308 by conventional wafer processing techniques, such as metal-organic chemical vapor deposition (MOCVD).

The lattice mismatch between III-Nitride and SiC is lower than the lattice mismatch between III-Nitride and diamond. As such, compared to a case where the SiC layer 1308 is not disposed between the III-Nitride layer 1310 and the diamond layer 1306, the III-Nitride 1310 on the SiC layer 1308 has an improved material property.

In embodiments, the III-Nitride layer 1310 of the wafer 1305 may be device processed to form various electrical components, such as transistors, using conventional wafer processing techniques. In embodiments, upon forming electrical components in the III-Nitride layer 1310, the Si substrate 1302 and the SiC layer 1304 may be removed by conventional techniques, such as chemical etching, dry etching, lapping (mechanical grinding) or chemical mechanical polishing (CMP). The wafer 1309, which includes the diamond layer 1306, SiC layer 1308, and III-Nitride layer 1310, may be diced and used in various electrical devices, such as high electron mobile transistors (HEMT). During operation of the devices, the heat energy generated by the III-Nitride layer 1310 may be transferred to the diamond layer 1306 to avoid failure of the devices due to the heat energy.

Since SiC has lower thermal conductivity than diamond, the heat flow from the III-Nitride layer 1310 to the diamond layer 1306 may be reduced if the SiC layer 1308 is too thick. In embodiments, the thickness of the SiC layer 1308 may be minimized so that the heat flow to the diamond layer 1306 is enhanced while the SiC layer 1308 may be still thick enough to enhance the material property of the III-Nitride layer 1310.

Figure 16:
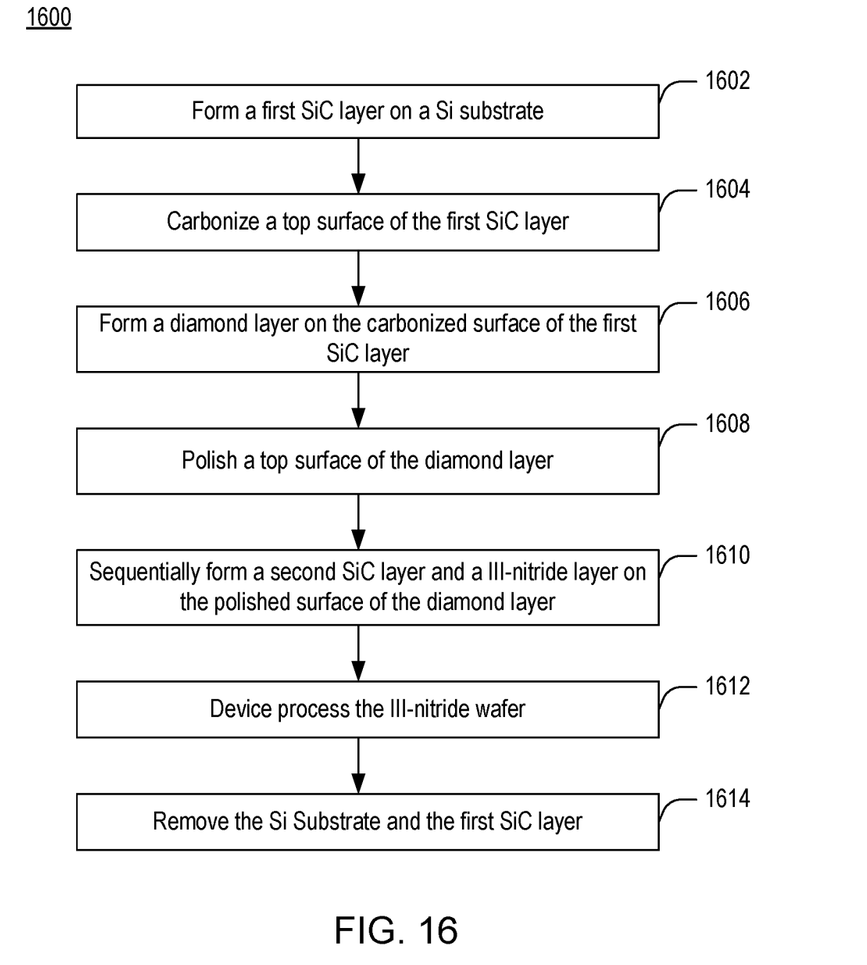
FIG. 16 shows a flowchart of an exemplary process for fabricating the wafers in FIGS. 13-15.

FIG. 16 shows a flowchart 1600 of an exemplary process for fabricating the wafers in FIGS. 13-15. At step 1602, a first SiC layer may be formed on a Si substrate. Then, at step 1604, a top surface of the first SiC layer may be carbonized by carbon containing gas, such as $C_2H_4$ or $C_3H_8$ or $C_2H_2$, causing carbon atoms to adhere to the top surface of the first SiC layer. At step 1606, a diamond layer may be formed on the first SiC layer, using the carbon atoms as seed particles for growing the diamond layer. At step 1608, a top surface of the diamond layer may be polished to generate a mirror-like epi-ready surface and to remove defects on the top surface.

At step 1610, a second SiC layer may be formed on the polished diamond surface and a III-Nitride layer may be formed on the second SiC layer. In embodiments, at step 1612, the III-Nitride layer may be device processed to form various electrical components, such as transistors, in the III-Nitride layer. At step 1614, the Si substrate and the first SiC layer may be removed.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A wafer, comprising:
   a semiconductor layer including a III-Nitride compound;
   a SiC layer formed on the semiconductor layer;
   an intermediate layer formed on the SiC layer;
   a seed layer formed on the intermediate layer, the seed layer including diamond particles; and
   a diamond layer formed on the seed layer.

2. The wafer of claim 1, wherein the SiC layer includes cubic silicon carbide.

3. A method for forming a wafer, comprising:
   forming a SiC layer on a silicon substrate;
   forming a semiconductor layer including a III-Nitride compound on the SiC layer;
   removing the silicon substrate to expose a surface of the SiC layer;
   forming an intermediate layer on the exposed surface of the SiC layer;
   forming a seed layer on the intermediate layer, the seed layer including diamond particles; and
   growing a diamond layer on the seed layer.

4. The method of claim 3, wherein the SiC layer includes cubic silicon carbide.

5. The method of claim 3, wherein the step of forming the seed layer includes adhering the diamond particles to the intermediate layer and wherein the diamond particles act as seed particles for growing the diamond layer.

6. A wafer, comprising:
   a semiconductor layer including a III-Nitride compound;
   an intermediate layer formed on the semiconductor layer;
   a seed layer formed on the intermediate layer, the seed layer including diamond particles; and
   a diamond layer formed on the seed layer.

7. A method for forming a wafer, comprising:
   forming a SiC layer on a silicon substrate;
   forming a semiconductor layer including a III-Nitride compound on the SiC layer;
   removing the silicon substrate and the SiC layer;
   forming an intermediate layer on the SiC layer;
   forming a seed layer on the intermediate layer, the seed layer including diamond particles; and
   growing a diamond layer on the seed layer.

8. The method of claim 7, wherein the SiC layer includes cubic silicon carbide.

9. The method of claim 7, wherein the step of forming the seed layer includes adhering the diamond particles to the intermediate layer and wherein the diamond particles act as seed particles for growing the diamond layer.

10. A wafer, comprising:
 a diamond layer having an oriented crystal structure;
 a SiC layer formed on the diamond layer; and
 a semiconductor layer including a III-Nitride compound and formed on the SiC layer.

11. The wafer of claim 10, wherein the SiC layer includes cubic silicon carbide.

12. A method for forming a wafer, comprising:
 forming an intermediate layer on a silicon substrate;
 forming a seed layer on the intermediate layer, the seed layer including diamond particles;
 growing a diamond layer on the seed layer;
 forming a SiC layer on the diamond layer;
 forming a semiconductor layer including a III-Nitride compound on the SiC layer; and
 removing the silicon substrate, seed layer and intermediate layer.

13. The method of claim 12, wherein the SiC layer includes cubic silicon carbide.

14. The method of claim 12, further comprising, prior to the step of removing the silicon substrate, seed layer and intermediate layer:
 forming one or more electronic components in the semiconductor layer.

15. The method of claim 12, wherein the diamond layer has an oriented crystal structure.

16. A method for forming a wafer, comprising:
 forming a first SiC layer on a silicon substrate;
 carbonizing a surface of the first SiC layer;
 growing a diamond layer on the carbonzied surface of the first SiC layer;
 forming a second SiC layer on the diamond layer;
 forming a semiconductor layer on the second SiC layer, the semiconductor layer including a III-Nitride compound; and
 removing the silicon substrate and the first SiC layer.

17. The method of claim 16, wherein at least one of the first and second SiC layers includes cubic silicon carbide.

18. The method of claim 16, further comprising, prior to the step of forming a second SiC layer:
 polishing a surface of the diamond layer,
 wherein the second SiC layer is formed on the polished surface of the diamond layer.

19. The method of claim 16, further comprising, prior to the step of removing the silicon substrate and the first SiC layer:
 forming one or more electronic components in the semiconductor layer.

20. The method of claim 16, wherein the diamond layer has an oriented crystal structure.

* * * * *